(12) United States Patent
Cowburn

(10) Patent No.: US 6,774,391 B1
(45) Date of Patent: Aug. 10, 2004

(54) MAGNETIC LOGIC ELEMENT

(75) Inventor: Russell Cowburn, Cambridge (GB)

(73) Assignee: Cambridge University Technical Svcs., Cambridge (GB)

( * ) Notice: Subject to any disclaimer, the term of this patent is extended or adjusted under 35 U.S.C. 154(b) by 16 days.

(21) Appl. No.: 10/111,803

(22) PCT Filed: Oct. 11, 2000

(86) PCT No.: PCT/GB00/03915

§ 371 (c)(1),
(2), (4) Date: May 29, 2002

(87) PCT Pub. No.: WO01/31789

PCT Pub. Date: May 3, 2001

(30) Foreign Application Priority Data

Oct. 25, 1999 (GB) .............................................. 9925213

(51) Int. Cl.[7] .......................... B82B 1/00; G01R 33/02; H01L 49/00; H03K 19/00
(52) U.S. Cl. ............................ 257/24; 257/14; 257/23; 365/41
(58) Field of Search ............................... 257/14, 23–25, 257/E29.245, E29.07, E29.071; 365/41

(56) References Cited

U.S. PATENT DOCUMENTS

| | | | |
|---|---|---|---|
| 5,346,851 A | 9/1994 | Randall et al. | 438/194 |
| 5,447,873 A | 9/1995 | Randall et al. | 438/172 |
| 5,783,840 A | 7/1998 | Randall et al. | 257/24 |
| 5,828,090 A | 10/1998 | Ugajin | 257/183.1 |
| 6,016,269 A | 1/2000 | Peterson et al. | 365/171 |
| 6,587,408 B1 * | 7/2003 | Jacobson et al. | 369/44.16 |

FOREIGN PATENT DOCUMENTS

| | | |
|---|---|---|
| DE | 41 18 152 A1 | 12/1992 |
| EP | 0 562 751 A2 | 9/1993 |
| EP | 0 534 7403 | 12/1993 |
| EP | 0 707 8961 | 3/1995 |
| EP | 0 724 9801 | 9/1995 |
| EP | 0 697 737 A1 | 2/1996 |
| GB | 2 256 313 A | 12/1992 |
| GB | 2 268 625 A | 1/1994 |
| GB | 2 328 096 A | 2/1999 |
| WO | WO 00/62311 | 10/2000 |

OTHER PUBLICATIONS

Brillouin light scattering by magnetic surface waves in dot–structured permalloy layers, S.M. Cherif et al., Journal of Magnetism and Magnetic Materials 175 (1997) 228–236.

Single–Domain Circular Nanomagnets, R.P. Cowburn et al., The American Physical Society, vol. 83, No. 5, Aug. 2, 1999.

Magnetization of small arrays of interacting single–domain particles, D. Grundler et al., American Institute of Physics, 1999.

Demonstration of a six–dot quantum cellular automata system, Islamshah Amlani et al., American Institute of Physics, vol. 72, No. 17, Apr. 27, 1998.

Experimental demonstration of quantum–dot cellular automata, Department of Electrical Engineering, University of Notre Dame, IOP Publishing Ltd., Mar. 1998.

Pinning effects of arrays of magnetic dots on niobium film, J.I. Martin et al., Physics Department, University of California San Diego, Elsevier Science B.V., 1998.

(List continued on next page.)

Primary Examiner—Minhloan Tran
Assistant Examiner—Thomas L. Dickey
(74) Attorney, Agent, or Firm—Dykema Gossett PLLC

(57) ABSTRACT

A logic device formed at least one chain of dots of magnetic material. Each dot has a width of 200 nm or less and is spaced at a distance that is sufficiently small to ensure magnetic interaction of adjacent dots.

10 Claims, 3 Drawing Sheets

OTHER PUBLICATIONS

High–frequency response and reversal dynamics of two–dimensional magnetic dot arrays, R.L. Stamps et al., The American Physical Society, Department of Physics, University of Colorado, 1998.

Ferromagnet–Semiconductor Hybrid Hall Effect Device, Mark Johnson et al., Naval Research Laboratory, Washington, D.C., 1997.

Hybrid ferromagnet–semiconductor devices, Mark Johnson, J. Vac. Sci. Technol. A 16(3), May 1998.

Lithographically patterned single–domain cobalt islands for high–density magnetic recording, R.M.H. New et al., Stanford University, Department of Electrical Engineering, Journal of Magnetism and Magnetic Materials 155 (1996) 140–145.

Submicron patterning of thin cobalt films for magnetic storage, R.M.H. New et al., J. Vac. Sci. Technol. B 12(6), Nov./Dec. 1994.

On One–Dimensional Quantum Cellular Automata, John Watrous, Computer Science Department, University of Wisconsin, Oct. 23, 1995.

Propagation of solitons of the magnetization in magnetic nanoparticle arrays, Satoshi Ishizaka et al., Elsevier Science B.V., 2000.

Quantum–dot Devices and Quantum–dot Cellular Automata, Wolfgang Porod, University of Notre Dame, Notre Dame, 1997.

Coupled quantum dots as quantum exclusive–OR gate, Jose A. Brum et al., Academic Press Limited, 1997, 431–436.

Self–organized quantum dots of diluted magnetic semiconductors $Cd_{1-x}Mn_x$ Te., Shinji Kuroda et al., Elsevier Science V.B., 2000.

Micromagnetics and interaction effects in the lattice of magnetic dots, Konstantin L. Metlov, 2000 Elsevier Science B.V.

Logical devices implemented using quantum cellular automata, P. Douglas Tougaw et al., J. Appl. Phys. 75 (3), Feb. 1, 1994.

Quantum cellular automata, Crag S. Lent et al., Department of Electrical Engineering, University of Notre Dame, Nanotechnology 4 (1993), 49–57.

Direct deposition of magnetic dots using a scanning tunneling microscope, M.A. McCord et al., Applied Physics Letters 57(1990).

Simple Model for the magneto–optical Kerr diffraction of a regular array of magnetic dots, Y. Suzuki et al., Elsevier Science B.V., Journal of Magnetism and Magnetic Materials 165 (1997).

* cited by examiner

Soliton flow direction

MAGNETIC LOGIC ELEMENT

This invention relates to the provision of logic circuitry by implementing the properties of magnetic quantum dots.

The integration density of silicon electronic devices such as microprocessors has followed steady exponential growth during the last forty years. While there is still much potential for future growth of silicon integration, a point will eventually come when further increase in integration density will become impossible. There is therefore a need to provide alternatives for digital logic. Ideally, one might like to move to molecular electronics where single molecules or atoms are used as logic gates and interconnect. There are, however, sufficient technological and scientific difficulties to be overcome in this field and so it is unlikely to replace silicon electronics directly. Much interest has recently been focussed on electronic quantum dots and single electron transistors as candidates for continuing the growth of integration density beyond that of conventional silicon devices. A particularly interesting configuration of quantum dots called a quantum cellular automaton (QCA) has shown the ability to perform logic operations. Unfortunately, these devices currently only work at very low temperatures.

According to the present invention there is provided a logic device formed from at least one chain of dots of magnetic material, each dot having a width of 200 nm or less and being spaced at a distance that is sufficiently small to ensure magnetic interaction of adjacent dots. The dots may be 100 nm or less, or 80 nm or less.

The dots may have a circular shape, an elliptical shape or a combination thereof.

The dots may be formed from a soft magnetic material, such as permalloy (Ni 80 Fe 20) or Co Fe.

The dots may be formed on a substrate formed from a material such as silicon.

The logic device may also comprise means for providing one or more controlled magnetic fields to the chain of dots. The means for providing a magnetic source may include means for controlling the source that the magnetic field or fields can operate as a controlling clock. In such a device plural chains may be arranged to provide OR gates, AND gates, NOT gates, a combination thereof, or any one of a number of other logic gates. Such a device may provide an electrical output or outputs by further comprising one or more components generating a magneto-electrical effect.

The present invention provides QCA using magnetic quantum dots. The design works well up to the Curie temperature of ferromagnetic metals (~1000K) and can be implemented with dots as large as 200 nm or as small as 10 nm. The invention therefore provides magnetic quantum cellular automata (MQCA) which can bridge the gap between conventional silicon devices and molecular electronics. 200 nm dots offer an increase in areal integration density (effective number of transistors per chip) of 400 times over today's CMOS; 10 nm dots offer a factor of 160000. Moreover, the fabrication of employing MQCA devices is relatively straightforward when compared with today's CMOS processes. MQCA according to the invention can therefore radically alter the economics of IC manufacturing, allowing smaller companies who cannot raise the capital for a CMOS fabrication (~US$2 Billion) to enter the market. In addition, being all magnetic, MQCA is well poised to interface to the emerging technology of Magnetic Random Access Memory (MRAM) which is set to replace all semiconductor computer memory in coming years.

One example of the present invention will now be described with reference to the accompanying drawings, in which.

Prior to describing the invention it is useful to provide some background.

Nanometre scale magnetic particles ('nanomagnets') have recently been the subject of intense scientific and technological research. These artificial 0-dimensional is structures are particularly interesting because as well as providing an excellent laboratory in which to study fundamental problems in magnetism, they are also very promising candidates for future technological applications such as ultrahigh density hard disk media and non-volatile memory for computing.

Much of the usefulness of nanomagnets arises as a consequence of a principle known as Brown's Fundamental Theorem which states that, because of a competition between magnetostatic energy and quantum mechanical exchange energy, magnetic domain formation should be entirely suppressed in very small (~$10^{-8}$ m) magnetic particles, causing nanomagnets to behave as single giant spins. The validity of this theorem in planar circular ferromagnetic disks has recently been demonstrated experimentally. It is thus possible to realise experimentally an isolated planar dipole moment of several thousand Bohr magnetons. Preferential in-plane directions (anisotropy) can additionally be selected by the choice of geometric shape of the nanomagnet. The magnetic field emanating from this giant spin can be several tens of Oersteds even at distances as large as 100 nm away. This is to be compared with kT/m, the thermal fluctuation energy expressed as a magnetic field, of around 1 Oe at room temperature (for say a 75 nm diameter disk of Permalloy, 10 nm thick). Nanomagnets can therefore be made to interact magnetostatically on an energy scale which is large compared to the thermal floor, even at room temperature and above.

(i) Logic States

Figure 1:
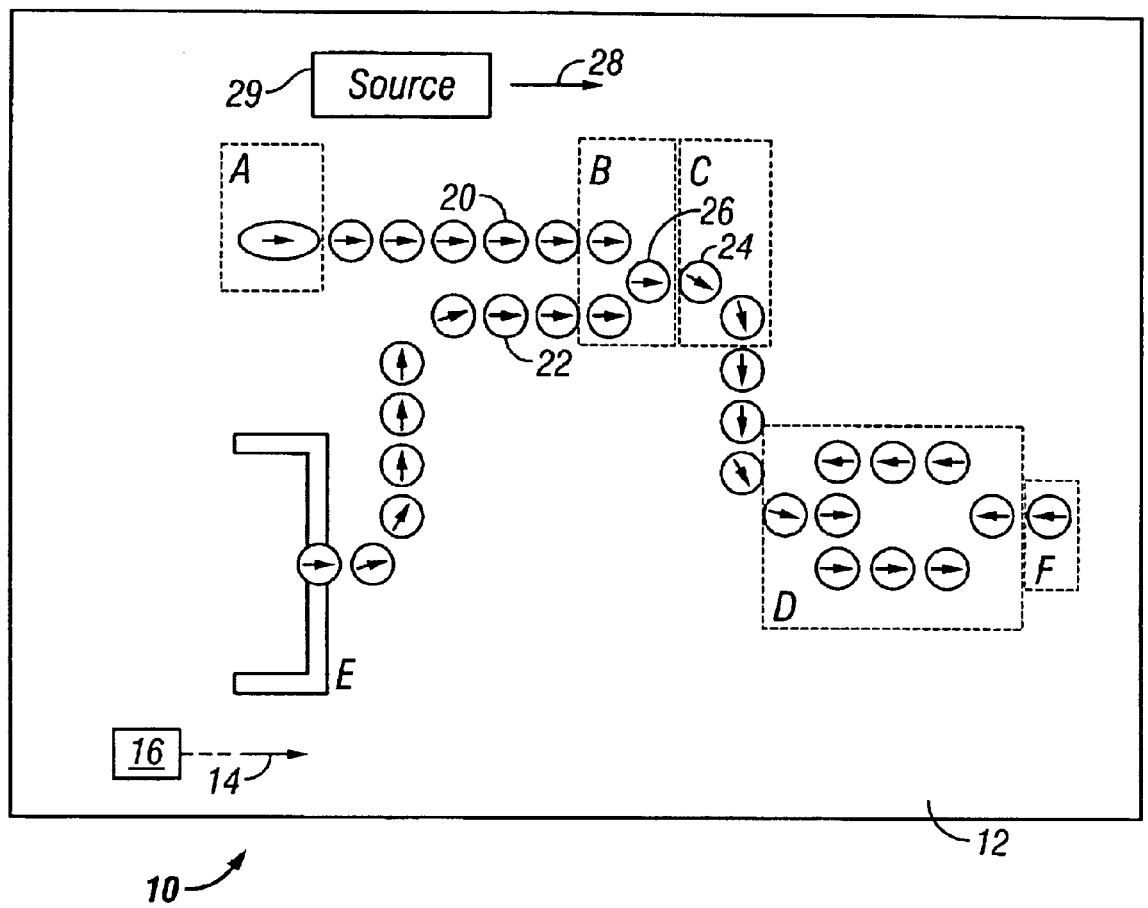
FIG. 1 is a schematic diagram of a logic device incorporating various principals according to the present invention.

FIG. 1 shows MQCA scheme according to the invention. Circular single domain disks of an isotropic ferromagnetic material are arranged on a chip 10 formed of a substrate 12 at a sufficiently small pitch that nearest neighbour disks share a strong magnetostatic interaction. Typical dimensions would be disks of 80 mn diameter and 15 nm thickness arranged on a 115 nm pitch. Each disk in this case can be represented as a giant planar spin. The circular shape of the disks ensures that the isolated spins experience an isotropic energy surface. Dipolar coupling is anisotropic, however, and so two neighbouring spins will prefer to point along the line joining their centres. The chains of dots shown in FIG. 1 are thus bistable: all of the spins in a chain can point along the chain but not transverse to the chain. The chain represents logic states using a variant of Boolean algebra that works with +1 and −1 instead of 1 and 0. In the case of a horizontal chain we define spins pointing to the left as being in state −1 and spins pointing to the right as being in state +1. In the case of a vertical chain we define spins pointing down the page as being in state −1 and spins pointing up the page as being in state +1.

(ii) Soliton Propagation

Figure 2:
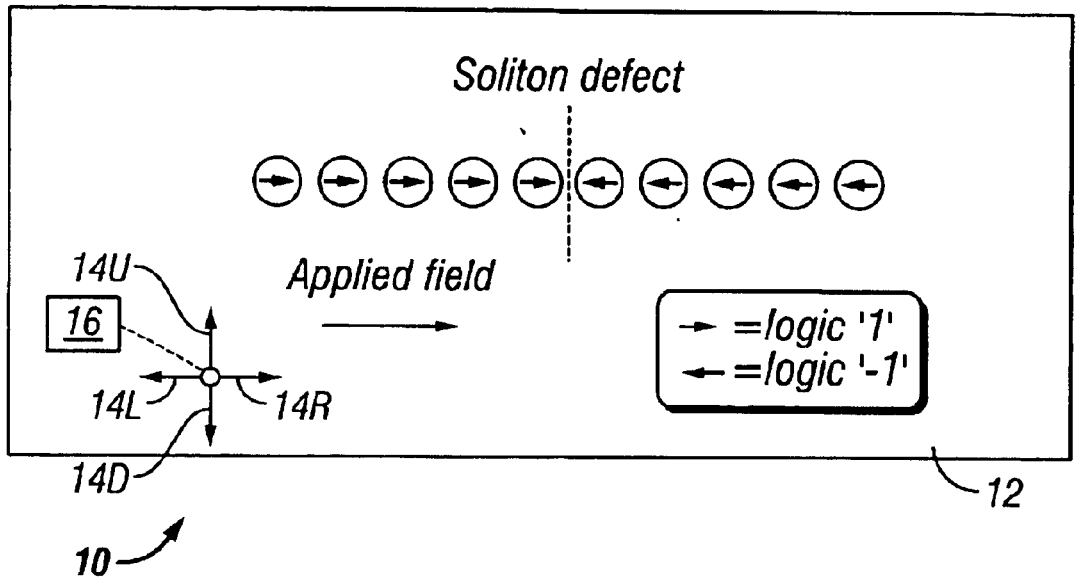
FIG. 2 is a schematic diagram showing a soliton defect in a logic element according to the present invention.

Suppose now that we set half of the spins in a chain to state +1 and the other half to state −1, as shown schematically in FIG. 2. These two states meet in the centre of the chain to form a defect. For simplicity, we have drawn the defect in FIG. 2 as being point-like, i.e. the transition from state −1 to +2 occurs abruptly. The defect will, in fact, have structure, i.e. the transition will occur over the space of a few dots. Suppose now that a small controlled magnetic field 14 is applied by a suitable source 16, oriented along the length of the chain. This will have the effect of energetically favouring spins in state +1 over those in state −1. The spins in state −1 which are far away from the defect are held in place by the interaction field of their nearest neighbours and so cannot reverse. The −1 spin at the defect feels zero net interaction, however, because the interaction field from its +1 neighbour is cancelled by that from its −1 neighbour. It is therefore free to reverse to align itself with the field, causing the defect to move to the right by one cell. This in turn increases the number of cells aligned with the field and so lowers the energy of the system. The same argument can then be applied to the new −1 defect spin and so the defect moves again and continues to do so until it reaches the end of the chain where it is annihilated. The defect is in fact a soliton, i.e. localized and able to be moved by an applied field. Solitons carry a topological charge: we call the soliton shown in FIG. 2 positive because it moves in the direction of positive applied field. A soliton mediating a transition from logic state −1 to +1 as one moves to the right would carry a negative charge and would move against the direction of positive applied field (i.e. to the left in FIG. 2).

Signals propagation in this MQCA scheme is thus mediated by magnetic solitons driven by a weak oscillating applied field. When the applied field is positive, positive. solitons move to the right and negative ones to the left. These topologically charged solitons are thus directly analogous to the electrons and holes used in semiconductor IC's. Instead of flowing along aluminium or copper wires under the action of an electric field, however,they propagate through a network of coupled magnetic quantum dots under the action of one or more magnetic fields. The magnetic field or fields can be globally applied to an entire chip and serves simultaneously as power supply to each dot (any energy involved in moving the soliton comes out of the applied field) and as a low-skew clock. A vectorial magnetic clock 18 field 14 which rotates, for example, in the plane of the device from up to page 14U to left 14L to down 14D the page to right 14R may be used in controlling synchronous operation of the logic network and in routing signals around corners and through gates.

(iii) Data Input

Data can be put into a chain from an elliptical nanomagnet, as highlighted in box A in FIG. 1. The elliptical form introduces a shape anisotropy which greatly increases its coercivity. It can therefore only be switched by strong externally applied fields (either from a globally applied field 14, or, locally from a current carrying track, as shown at point E in FIG. 1) and is unaffected by the interaction field from the circular nanomagnets. A soliton can therefore not annihilate at the end of a chain carrying an elliptical cell; it can, however, annihilate at the free end of a chain. This asymmetry guarantees that after one applied field cycle, each of the cells in the brain will be set to the logic state of the elliptical cell and will be stable. Elliptical cells therefore act as input pins and have their logic state transmitted down any connecting chains. Alternatively, the magnetic state of a dot in a chain can be flipped by applying a high density pulse of spin polarized electron current via a ferromagnetic point contact.

(iv) Logic Gate

Logic gates can be made by piping three chains 20, 22, 24 of dots together, as shown in box B of FIG. 1. In this case, the two chains 20, 22 arriving from the left are inputs and the chain 24 leaving to the right is the output. The nodal dot 26 experiences the vector sum of the interaction fields coming from the chains 20, 22 and so performs a summation function. Boolean AND or OR functions can be achieved in this way by applying a bias magnetic field 28 from a source 29.

As noted above, the applied field will establish logic states, depending on the Field Strength, and direction Boxes B & C will exhibit AND, or OR functions. A NOT function can be preformed by the arrangement of dots shown in box D. An important feature of the logic gates described here and indeed of this entire scheme is that logic signals can be fed back to make a latch. Full synchronous state machines can therefore be implemented.

(v) Complex Networks

Figure 3:
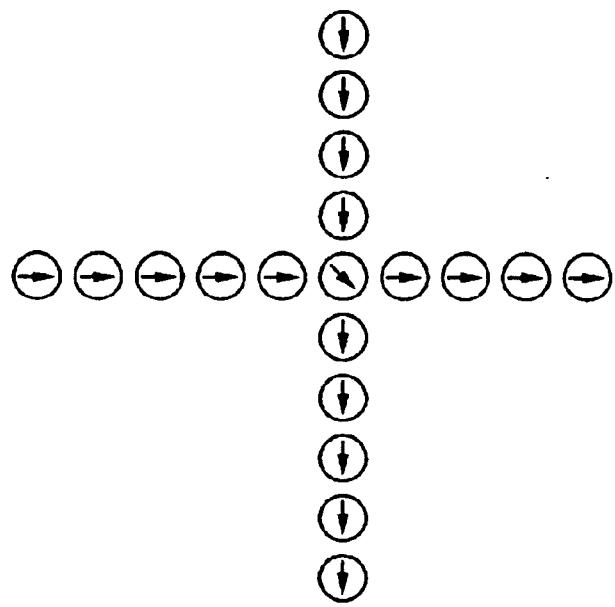
FIG. 3 shows how logic interconnections according to the invention can cross over one another without adverse interference.

The design is not limited to the linear chains so far discussed. If the globally applied magnetic field is applied at 45° to the x and y directions, then chains can be constructed along the x and y directions and corners turned, as shown in box C of FIG. 1. One of the major advantages of QCA and MQCA over conventional CMOS is that chains can cross each other as shown in FIG. 3. In this case, the solitons should pass through each other without interfering. A consequence of this is that a large, complex logic unit such as a central processing unit can all be built on a single plane without the need for multilayer processing and vias. The fabrication cost (both capital investment and cost per unit) is thus reduced compared with CMOS. Alternatively, multiple planes of interacting dots can be used to achieve 3-dimensional logic hardware. The various planes can be made to be non-interacting (and simply used to increase the complexity of a single chip) by spacing the planes by a distance greater than the dot diameter. Conversely, signals can be passed between planes by spacing the planes by a distance smaller than the dot diameter. Signal "vias" between planes can thus easily be implemented. Increases in device complexity can readily be achieved through this 3-dimensional architecture.

(vi) Data Output

Logic signals can be converted from a magnetic form to an electronic form at the final output stages of a chip (e.g. dot 'F' in FIG. 1) using magneto-electronic effect such as Tunnel Magneto Resistance (TMR).

(vii) Impedance Matching

Figure 4A:
FIGS. 4A, 4B and 4C are schematic diagrams showing how an example of the present invention can be configured to provide impedance matching.
Figure 4B:
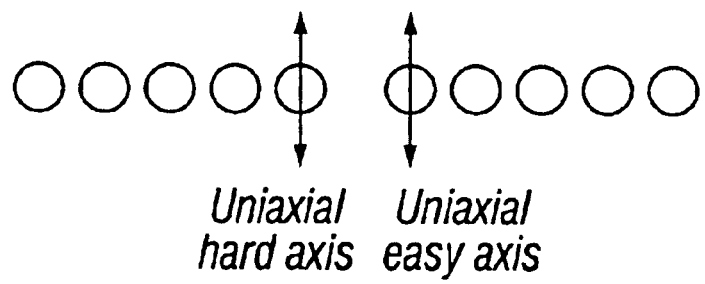
Figure 4C:
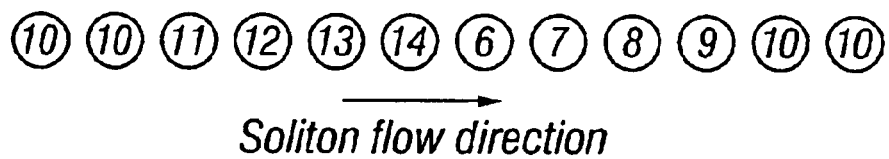

High frequency electronic circuits must be impedance matched at every junction to avoid reflections. An analogous concept exists in MOCA, although not just at high frequencies. FIG. 4(*a*) illustrates the situation. Suppose the spacing between two dots in a chain is larger than usual, leading to weaker coupling at that point. This might occur at a corner or in a gate design. Suppose now that a soliton is propagating from left to right. When it arrives at the weakly coupled point, it will experience an obstacle to its motion because the field due to dot A experienced at dot B is not strong enough to compensate the field due to dot C experienced at dot B. The soliton cannot propagate through this point unless a larger driving field is applied, which may be undesirable. The solution is to apply a weak anisotropy to dot B by making it slightly elliptical. Another anisotropy of opposite sign can also be applied to dot A. FIG. 4(b) shows the final configuration. In this case the weak coupling from A to B is compensated by the anisotropy field at B. A further interesting feature of this configuration is that it is unidirectional. A soliton propagating from right to left would experience an enhanced obstruction. This weakly linked junction is thus a soliton diode and can be used to control the routing of signals in a MQCA system. Coupling strength can be changed through the dot thickness as well. FIG. 4C shows an alternative form of a soliton diode that uses an abrupt change in dot thickness to achieve unidirectionality. The number in each dot gives the dot thickness in nanometres.

Figure 5:
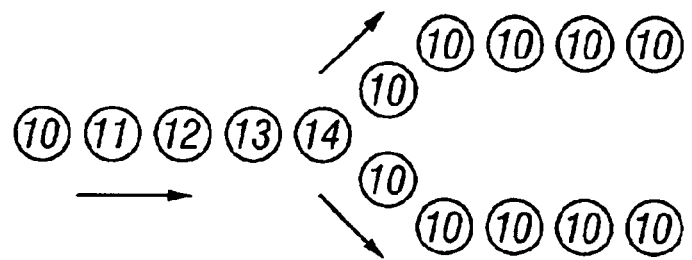
FIG. 5 shows how signal fan-out may be achieved according to the invention by changing the thickness of dots in the vicinity of the splitting of the chain.

Fan-out of a logic gate into the inputs of several other gates is an important feature of any useful logic system. MQCA is able to achieve fan out using the gate structure of box B in FIG. 1 in reverse. Small anisotropies can be induced in the cells close to the junction to achieve impedance matching. The diode effect of such anisotropies prevents signals flowing back into the output of a gate. Alternatively, fan-out can be achieved by gradually changing dot thickness in the vicinity of the chain splitting, as shown in FIG. 5. The number in each dot gives the dot thickness on nanometres.

What is claimed is:

1. A logic device formed from at least one chain of dots of magnetic material, each dot having an elliptical shape and a width of 200 nm or less and being spaced at a distance that is sufficiently small to ensure interaction of adjacent dots.

2. A logic device according to claim 1, wherein the dots are 100 nm or less.

3. A logic device according to claim 1, wherein the dots are 80 nm or less.

4. A logic device according to claim 1, wherein the dots are formed from a soft magnetic material.

5. A logic device according to claim 1, wherein the dots are formed on a substrate formed from silicon.

6. A logic device according to claim 1, wherein further comprising means for providing a controlled magnetic field to the chain of dots.

7. A logic device according to claim 6, including means for controlling the means for providing the controlled magnetic field; such that the magnetic field operates as a vectorial magnetic clock.

8. A logic device according to claim 7, wherein plural chains are provided and are biased to provide one or more of OR, AND, NOT gate functions.

9. A logic device according to claim 8, arranged to provide an electrical output or outputs by further comprising one or more components generating a magneto-electrical effect.

10. A logic device formed from at least one chain of dots of magnetic material, each dot having a width of 200 mm or less and being spaced at a distance that is sufficiently small to ensure interaction of adjacent dots; further including means for providing a magnetic field to the chain of dots, and means for controlling the means for providing the controlled magnetic field, such that the magnetic field operates as a vectorial magnetic clock.

* * * * *